United States Patent
Chiang et al.

(10) Patent No.: US 7,326,302 B2
(45) Date of Patent: Feb. 5, 2008

(54) APPARATUS AND METHOD FOR PROCESSING A SUBSTRATE

(75) Inventors: Kun-Hsiang Chiang, Hsinchu Hsien (TW); Hua-Chun Yuan, Taoyuan Hsien (TW)

(73) Assignee: Hannstar Display Corporation, Taipei (TW)

( * ) Notice: Subject to any disclaimer, the term of this patent is extended or adjusted under 35 U.S.C. 154(b) by 165 days.

(21) Appl. No.: 10/924,473

(22) Filed: Aug. 24, 2004

(65) Prior Publication Data

US 2006/0013960 A1    Jan. 19, 2006

(30) Foreign Application Priority Data

Jul. 2, 2004    (TW) ............................... 93120034 A

(51) Int. Cl.
- *B05C 5/00* (2006.01)
- *B05C 11/00* (2006.01)
- *B05C 3/00* (2006.01)
- *B05B 1/08* (2006.01)
- *B05B 9/00* (2006.01)

(52) U.S. Cl. .................. 118/684; 118/667; 118/300; 118/411; 239/99; 239/101; 239/124; 239/127

(58) Field of Classification Search ............. 118/52, 118/612, 666, 300, 667, 683–684, 692, 410–411; 396/604, 611; 438/758; 239/99, 71, 101, 239/124, 127, 413, 414, 416.3, 569
See application file for complete search history.

(56) References Cited

U.S. PATENT DOCUMENTS

| 3,991,822 | A | * | 11/1976 | Morris | 165/140 |
| 4,043,739 | A | * | 8/1977 | Appel | 425/461 |
| 4,623,501 | A | * | 11/1986 | Ishizaki | 427/286 |
| 4,687,137 | A | * | 8/1987 | Boger et al. | 239/124 |
| 5,211,342 | A | * | 5/1993 | Hoy et al. | 239/707 |
| 5,306,528 | A | * | 4/1994 | Bruehs | 427/420 |
| 5,395,653 | A | * | 3/1995 | Baum | 427/356 |
| 5,733,597 | A | * | 3/1998 | Schmitkons et al. | 427/96.4 |
| 6,089,469 | A | * | 7/2000 | Fusama et al. | 239/71 |
| 6,106,900 | A | * | 8/2000 | Innes et al. | 427/358 |

* cited by examiner

*Primary Examiner*—Yewebdar Tadesse
(74) *Attorney, Agent, or Firm*—Thomas, Kayden, Horstemeyer & Risley

(57) ABSTRACT

An apparatus for processing a substrate has a liquid supply unit, a nozzle unit, a first valve and a second valve. The liquid supply unit has an output port and an input port, and a processing liquid is output from the output port. The nozzle unit has a first port and a second port, and the first port is connected to the output port of the liquid supply unit. The first valve is connected between the second port of the nozzle unit and the input port of the liquid supply unit. The second valve is connected between the second port of the nozzle unit and the output port of the liquid supply unit. Moreover, the switch states of the first and second valves are opposite in order to control whether the nozzle unit spreads the processing liquid on the substrate.

19 Claims, 5 Drawing Sheets

APPARATUS AND METHOD FOR PROCESSING A SUBSTRATE

BACKGROUND

1. Field of Invention

The present invention relates to a substrate processing process. More particularly, the present invention relates to an apparatus and a method for spreading a processing liquid on the substrate.

2. Description of Related Art

Lithography is essential in the semiconductor process. Generally, the lithography process comprises the following steps: spreading a photoresist layer, exposing the photoresist layer to light, and developing the photoresist layer with a developer solution. For example, the photoresist layer of positive resists is exposed with UV light wherever the underlying material is to be removed. In these resists, exposure to the UV light changes the chemical structure of the resist so that it becomes more soluble in the developer. The exposed resist is reacted with the developer solution then washed away, leaving windows of the bare underlying material. On the other hand, negative photoresist behave in just the opposite manner. It is a material that becomes polymerized and insoluble when exposed to UV light. Therefore, the negative resist remains on the surface wherever it is exposed, and the developer solution removes only the unexposed portions. The pattern of the mask is transferred by these steps to the photoresist layer covering on the substrate.

The lithography process for manufacturing flat display panels is achieved by similar methods. After spreading photoresist on a substrate, a required pattern is defined by exposure, and a development process is then carried out. The development is preceded in a substrate development apparatus. FIG. 1A illustrates a schematic view of a conventional development apparatus. A substrate 110 is fixed on a substrate support unit 106. The substrate support unit 106 is positioned below the substrate 110, and holds the substrate 110 by vacuum or mechanical means.

A nozzle unit 104 is located above the surface of the substrate 110 for spreading developer solution on the substrate 110 to develop the photoresist. The conventional nozzle unit 104 has an injection port 112 and an exhaust port 114. A developer solution supply unit 102 provides the developer solution to the nozzle unit 104 circularly by the injection port 112 and the exhaust port 114.

FIG. 1B illustrates a process for of the substrate development apparatus in FIG. 1A. The developer solution supply unit 102 comprises a tank 132, a pump 134 and a temperature control device 136. After being pressurized by the pump 134 and the temperature thereof being adjusted by the temperature control device 136, the developer solution stored in the tank 132 is supplied to the nozzle unit 104 through the injection port 112.

As illustrated in FIG. 1B, when the developer solution is not needed, a valve 124 is opened such that the developer solution supplied to the nozzle unit 104 is circulated back to the developer solution supplying unit 102 through the exhaust port 114. In other words, the development apparatus is a circulating system at this time, and the developer solution is thus circulated inside to maintain its temperature. When the developer solution is to be spread, valve 124 is closed, and the developer solution supplied to the nozzle unit 104 is thus spread on the substrate 110 through the nozzle of the nozzle unit 104.

However, the length of the nozzle unit 104 becomes greater because the size of the substrate used for manufacturing display becomes larger, and the nozzle unit 104 has only one injection port 112, which is positioned on one side of the nozzle unit 104. When the developer solution is spread on the substrate 110 by the nozzle unit 104, a wave crest of the developer solution is easily generated on the substrate 110 because the pressures applied on the developer solution inside the two ends of the nozzle unit 104 are unbalanced.

FIG. 1C illustrate a schematic view of a conventional nozzle unit and a wave crest of the developer solution generated by the convention nozzle unit, and FIG. 1D illustrates a schematic view of spreading the developer solution on the substrate by the conventional nozzle unit. The following descriptions are made with reference to FIG. 1C and FIG. 1D.

As mentioned above, when the developer solution is spread, the developer solution is pressurized and supplied to the nozzle unit 104 through the injection port 112, which is positioned on one side of the nozzle unit 104. The pressure of the developer solution inside the nozzle unit 104 is decreased corresponding to the distance away from the injection port 112. In order words, the pressure of the developer solution near the injection port 112 is greater than the pressure of the developer solution distant from the injection port 112 (such as the pressure of the developer solution near the exhaust port 114). Moreover, the developer solution with the greater pressure passes through the nozzle of the nozzle unit 104 more easily. When the developer solution is spread by the conventional nozzle unit 104, a wave crest 142 of the developer solution is easily generated on the substrate 110 near the injection port 112.

For instance, the offset of the wave crest 142 of the developer solution generated by a nozzle unit 104 of which the length is 650 mm is about 50 to 100 mm. The offset of the wave crest causes suboptimal development such that the line width of the photoresist pattern is not uniform, and further affects the yield of products. More particularly, this suboptimal development especially affects the manufacturing of large-sized flat display panels.

SUMMARY

It is therefore an objective of the present invention to provide an apparatus for processing a substrate that modifies the original piping design of the nozzle unit to mitigate the offset of wave crest of processing liquid and improve the line width uniformity.

It is another objective of the present invention to provide a method for processing a substrate that balances the pressure applied on the processing liquid inside the two ends of the nozzle unit to decrease the offset of the wave crest of processing liquid.

In accordance with the foregoing and other objectives of the present invention, an apparatus and a method for processing a substrate are provided. The apparatus comprises a liquid supply unit, a nozzle unit, a first valve and a second valve. The liquid supply unit has an output port and an input port, and a processing liquid is output from the output port. The nozzle unit has a first port and a second port, and the first port is connected to the output port of the liquid supply unit. The first valve is connected between the second port of the nozzle unit and the input port of the liquid supply unit. The second valve is connected between the second port of the nozzle unit and the output port of the liquid supply unit. Moreover, the switching states of the first and second valves are opposite in order to control whether the nozzle unit spreads the processing liquid on the substrate.

In another aspect, the method of the present invention places a nozzle unit above the substrate, and the nozzle unit has a first port and a second port. When the processing liquid is to be spread, the processing liquid is input simultaneously from the first and second ports such that the processing liquid is distributed over the whole nozzle unit and is spread on the substrate.

The apparatus and method of the present invention are suitable for general substrate processing processes, such as the process for spreading developer solution or other processing liquids. The invention can easily balance the pressure applied on the processing liquid inside the two ends of the nozzle unit by modifying the original piping design of the nozzle unit, and therefore provides a cheap improving way. The invention mitigates the offset of wave crest of processing liquid, improves the line width uniformity, raises the yield of products and shortens the processing time.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings, where:

DESCRIPTION OF THE PREFERRED EMBODIMENTS

Figure 1A:
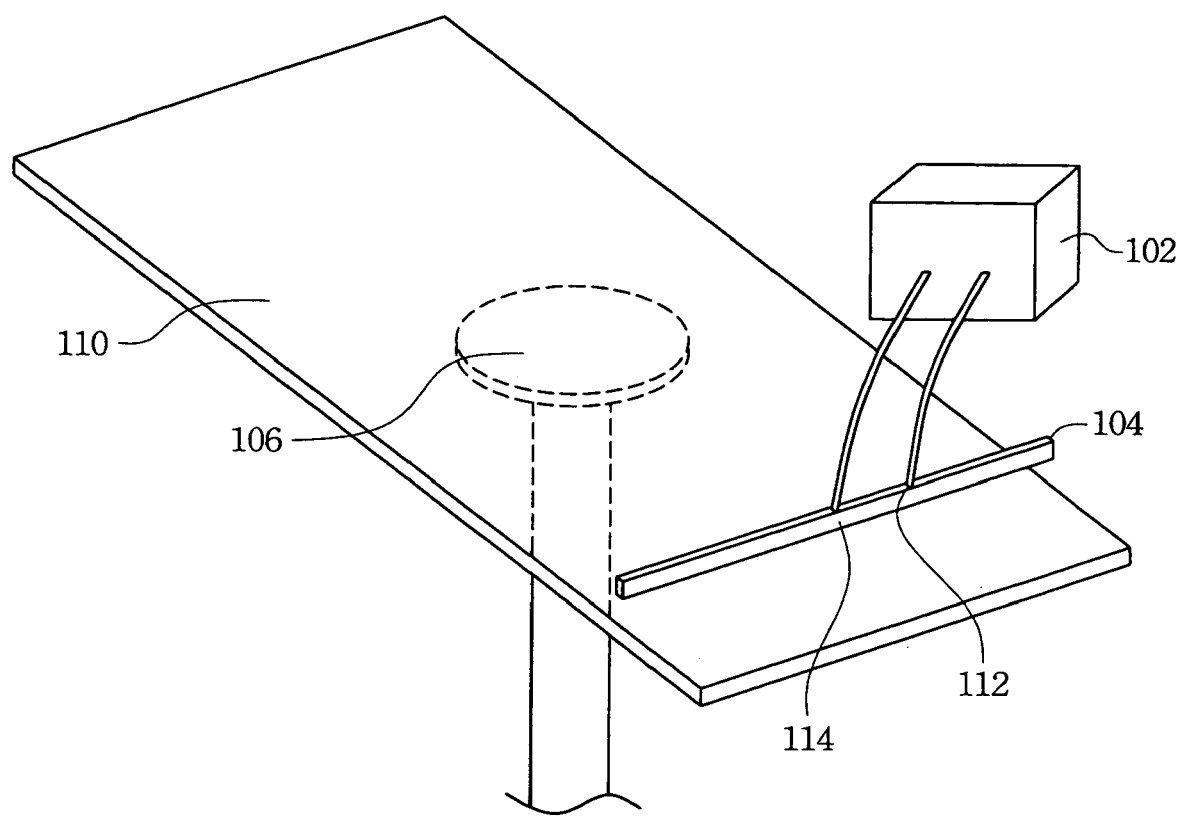
FIG. 1A is a schematic view of a conventional substrate development apparatus.
Figure 1B:
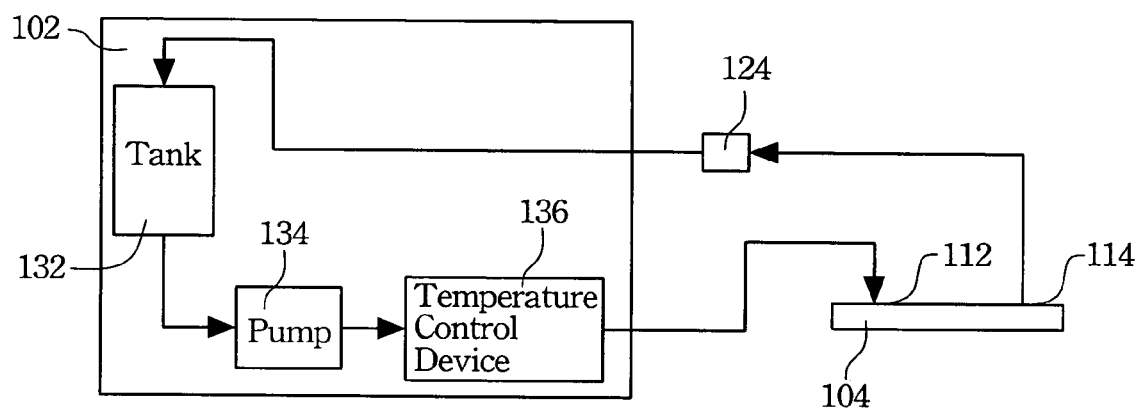
FIG. 1B illustrates a process for the substrate development apparatus in FIG. 1A.
Figure 1C:
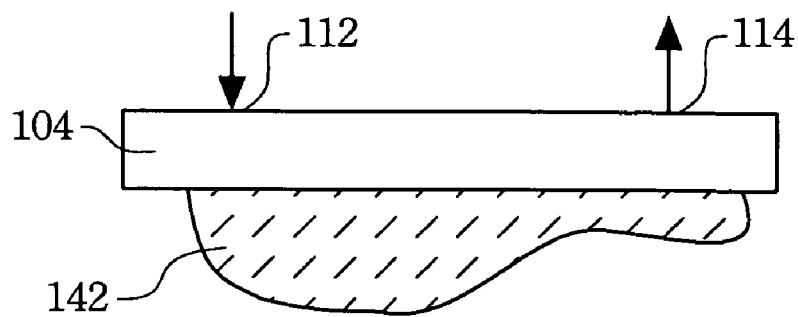
FIG. 1C is a schematic view of a conventional nozzle unit and a wave crest of the developer solution generated by the convention nozzle unit.
Figure 1D:
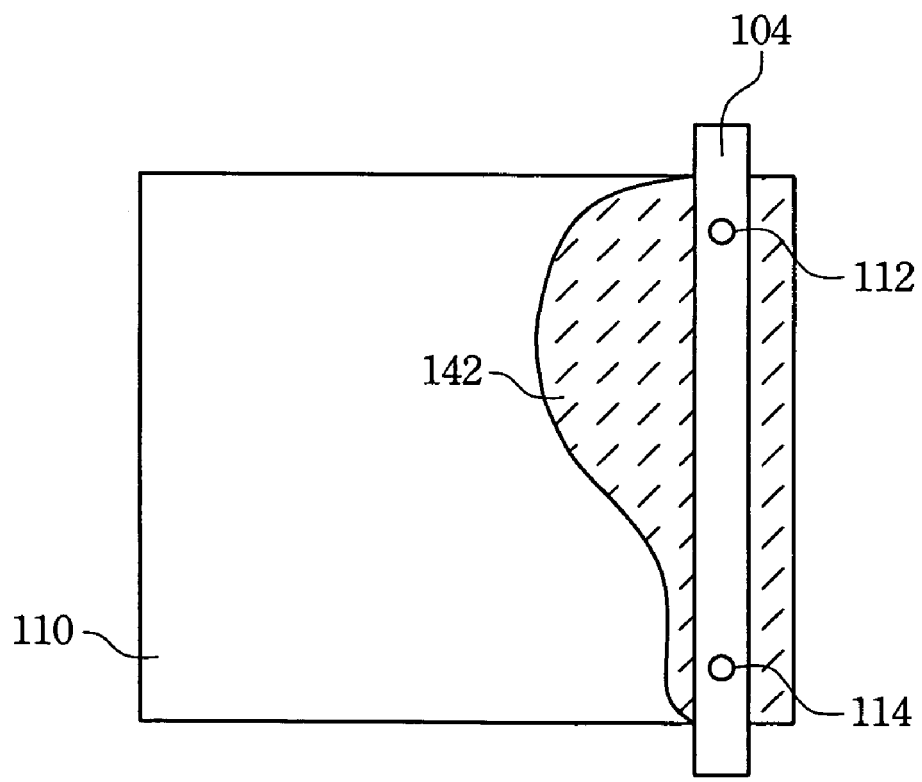
FIG. 1D is a schematic view of spreading the developer solution on the substrate by the conventional nozzle unit.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
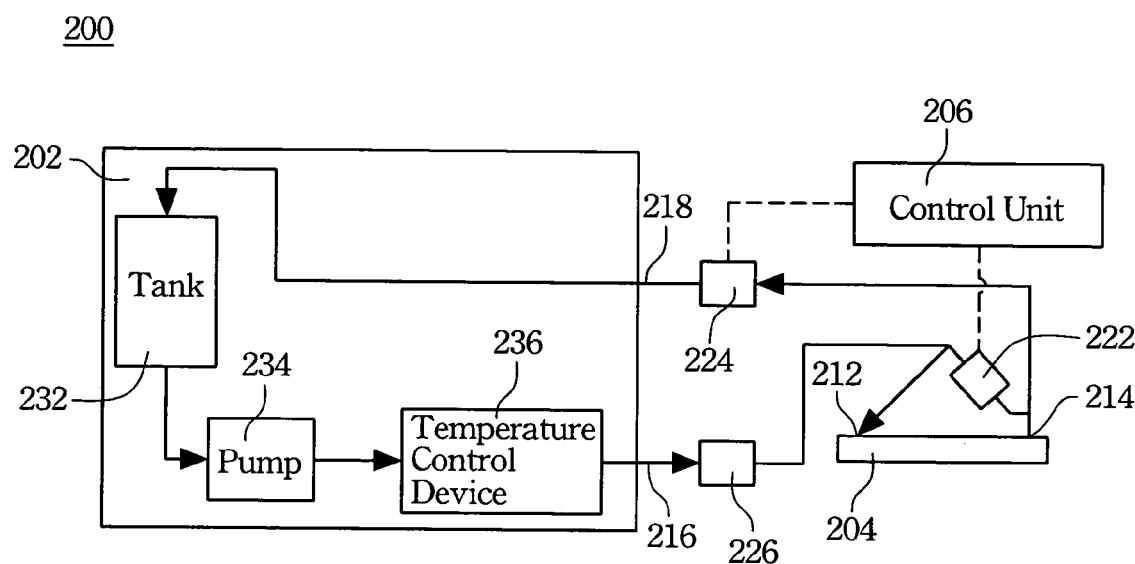
FIG. 2A illustrates a process of one preferred embodiment of the present invention.

FIG. 2A illustrates a process of one preferred embodiment of the present invention. In the preferred embodiment, a substrate processing apparatus 200 comprises a liquid supply unit 202, a nozzle unit 204, a first valve 224 and a second valve 222. The liquid supply unit 202 has an output port 216 and an input port 218, and a processing liquid is output from the output port 216. For examples, the processing liquid can be photoresist, developer solution, CMP (Chemical Mechanical Planarization) slurry, or further liquid crystals and so on.

The nozzle unit 204 has a first port 212, a second port 214 and a plurality of spreading units (not illustrated in FIG. 2A). The spreading unit, such as a nozzle, can uniformly provide the processing liquid to the substrate by capillarity. The output port 216 of the liquid supply unit 202 is connected to the first port 212 and the second port 214. The output port 216 of the liquid supply unit 202 inputs the processing liquid from the two ends of the nozzle unit 204 at the same time and thus balances the pressure applied on the processing liquid inside the two ends of the nozzle unit 204.

In other words, the first port 212 and the second port 214 of the nozzle unit 204 are used as injection ports for inputting the processing liquid at this time. In addition, the first port 212 and the second port 214 of the nozzle unit 204 are not limited to configuration on the two ends of the nozzle unit 204. Under considerations of pressures and flow rates, the first port 212 and the second port 214 also can be configured in other positions symmetrical to the center of the nozzle unit 204.

Moreover, the first valve 224 is connected between the second port 214 of the nozzle unit 204 and the input port 218 of the liquid supply unit 202. The second valve 222 is connected between the second port 214 of the nozzle unit 204 and the output port 216 of the liquid supply unit 202. The switch states of the first and second valves 224 and 222 are opposite.

In the preferred embodiment, the first valve 224 is a normal open valve, and the second valve 222 is a normal close valve. In the beginning, the first valve 224 is opened and the second valve 222 is closed. The processing liquid at this time is continuously circulated in the substrate processing apparatus 200 to maintain its temperature and wait for processing. The first valve 224 can be a solenoid valve or an air operation valve, and the second valve 222 can be a solenoid valve or an air operation valve.

Furthermore, the substrate processing apparatus 200 further comprises a third valve 226 connected between the first port 212 of the nozzle unit 204 and the output port 216 of the liquid supply unit 202. The third valve 226 further controls whether the processing liquid is input into the nozzle unit 204. According to one preferred embodiment of the present invention, the third valve 226 is a normal open valve, which collocates the normal-open first valve 224 and the normal-close second valve 222 to circulate the processing liquid from the output port 216 to the input port 218. Similarly, the third valve 226 can be a solenoid valve or an air operation valve.

However, according to another preferred embodiment of the present invention, the third valve 225 also can be a normal close valve, which collocates the normal-open first valve 224 and the normal-close second valve 222, and the processing liquid in this preferred embodiment is not circulated continuously. That is, a dummy step is performed when the processing liquid is to be spread on the substrate; when the spreading is finished, i.e. when the processing liquid is no longer being spread on the substrate, the third valve 226 is closed to stop provision of processing liquid to the nozzle unit 204.

Moreover, in the preferred embodiment, the liquid supply unit 202 comprises a tank 232, a pressurizing device 234 (like a pump) and a temperature control device 236. The processing liquid used for substrate processing is stored in the tank 232 at the beginning. After being pressurized by the pressurizing device 234 and adjusted the temperature thereof by the temperature control device 236, the processing liquid is output through the output port 216 and supplied to the nozzle unit 204 for substrate processing.

The following descriptions disclose another liquid supply unit suitable for the present invention. The liquid supply unit comprises a heating tank and a pressurizing device. That is, when the liquid supply unit gets a supplying signal, the heating tank begins to heat the processing liquid to a predetermined temperature, and then the pressurizing device pressurizes and outputs the processing liquid. In addition, the pipes for outputting the processing liquid further have thermal insulation components such as foams including closed-cell or open cell PE, EVA, PVC, NBR/PVC, EPDM, CR and so on, to maintain the temperature of the processing liquid.

Figure 2B:
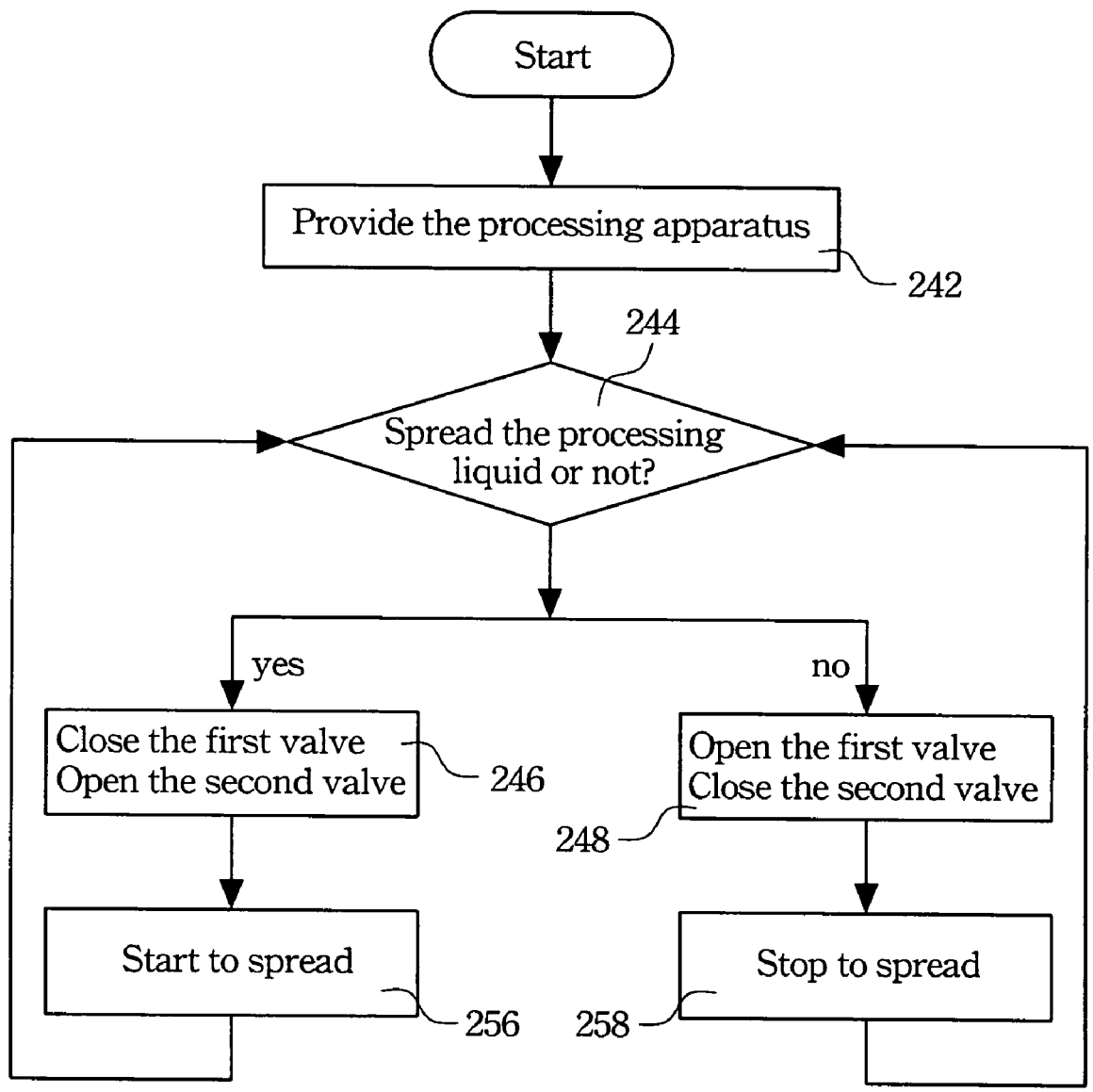
FIG. 2B is a flow chart of manipulating the substrate processing apparatus in FIG. 2A.

FIG. 2B illustrates a flow chart of manipulating the substrate processing apparatus in FIG. 2A, and the following descriptions are made with reference to FIG. 2A and FIG. 2B. The substrate processing apparatus 200 as illustrated in FIG. 2A is provided, and the nozzle unit 204 is placed above the substrate (step 242). The switch states of the first valve 224 and the second valve 222 are controlled by the same signal sent from a control unit 206 (step 244). The switch states of the two valves 224 and 222 are used to control whether the nozzle unit 204 spreads the processing liquid on the substrate.

When the processing liquid is to be spread on the substrate, a route from the output port 216 of the liquid supply unit 202 to the second port 214 of the nozzle unit 204 is opened, and a route from the second port 214 of the nozzle unit 204 to the input port 218 of the liquid supply unit 202 is closed (step 246). That is, the first valve 224 is closed and the second valve 222 is opened such that the processing liquid cannot be circulated back to the liquid supply unit 202, and therefore the processing liquid is spread on the substrate by the nozzle of the nozzle unit 204 (step 256).

When the processing liquid is not to be spread on the substrate, the route from the output port 216 of the liquid supply unit 202 to the second port 214 of the nozzle unit 204 is closed, and the route from the second port 214 of the nozzle unit 204 to the input port 218 of the liquid supply unit 202 is opened (step 248). In other words, the first valve 224 is opened and the second valve 222 is closed such that the processing liquid is no longer spread on the substrate and is circulated back to the liquid supply unit 202 through the second port 214 (step 258). The substrate processing apparatus 200 is a circulating system at this time, and the processing liquid is thus circulated inside to maintain its temperature.

Therefore, when the processing liquid is no longer being spread, the second port 214 can be used as an exhaust port to circulate the processing liquid back to the liquid supply unit 202. When the processing liquid is to be spread, the second port 214 can be used as a injection port like the first port 212 to input the processing liquid into the nozzle unit 204, and thus the pressures applied on the processing liquid inside the two ends of the nozzle unit 204 are balanced. In short, the second port 214 has both functions of injecting and exhausting, and therefore can mitigate the offset of wave crest of processing liquid, improve the line width uniformity, and raise the yield of products.

In addition, if the size of the substrate is very large, the nozzle unit 204 can be moved from one end to the other end of the substrate to spread the processing liquid on the whole substrate when the process is carried out. Because the processing liquid is input from the two ends of the nozzle unit 204, the inputting pressures of the two ends are therefore raised. When the inputting pressures of the two ends are larger, the spreading speed of the process is faster, and the inputting of the processing liquid from the two ends also decreases the waiting time of the conventional spreading technique. Therefore, the present invention can shorten the processing time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for processing a substrate, the apparatus comprising:
    a liquid supply unit, having an output port and an input port, wherein the output port outputs a processing liquid;
    a nozzle unit, having a first port and a second port, wherein the first port is connected to the output port;
    a first valve, connected between the second port and the input port;
    a second valve, connected between the second port and the output port, wherein switch states of the first and second valves are opposite to control the nozzle unit and the processing liquid flow into the nozzle unit through both the first and second ports when the second valve is opened; and
    a third valve, connected between the second valve and the output port.

2. The apparatus of claim 1, wherein the first valve is a normal open valve, and the second valve is a normal close valve.

3. The apparatus of claim 1, wherein the third valve is a normal close valve.

4. The apparatus of claim 1, wherein the third valve is a normal open valve to circulate the processing liquid from the output port to the input port.

5. The apparatus of claim 1, wherein the third valve is a solenoid valve or an air operation valve.

6. The apparatus of claim 1, wherein the apparatus further comprises:
    a control unit, switching the switch states of the first and second valves by a same signal.

7. The apparatus of claim 1, wherein the liquid supply unit comprises a temperature control device to adjust a temperature of the processing liquid.

8. The apparatus of claim 1, wherein the liquid supply unit comprises a pressurizing device to pressure the processing liquid.

9. The apparatus of claim 1, wherein the first valve is a solenoid valve or an air operation valve.

10. The apparatus of claim 1, wherein the second valve is a solenoid valve or an air operation valve.

11. The apparatus of claim 1, wherein the apparatus further comprises:
    a plurality of thermal insulation components to maintain a temperature of the processing liquid.

12. An apparatus for processing a substrate, the apparatus comprising:
    a liquid supply unit, having an output port and an input port, wherein the output port outputs a processing liquid;
    a nozzle unit, having a first port and a second port, wherein the first port is connected to the output port;
    a first valve, connected between the second port and the input port; and
    a second valve, connected between the second port and the output port, wherein switch states of the first and second valves are opposite to control the nozzle unit, the processing liquid flow into the nozzle unit through both the first and second ports when the second valve is opened, and the first port is connected to the output port without though the second valve.

13. The apparatus of claim 12, wherein the first valve is a normal open valve, and the second valve is a normal close valve.

14. The apparatus of claim 12, wherein the apparatus further comprises:
   a third valve, connected between the second valve and the output port.

15. The apparatus of claim 12, wherein the apparatus further comprises:
   a control unit, switching the switch states of the first and second valves by a same signal.

16. The apparatus of claim 12, wherein the liquid supply unit comprises a temperature control device to adjust a temperature of the processing liquid.

17. The apparatus of claim 12, wherein the first valve is a solenoid valve or an air operation valve.

18. The apparatus of claim 12, wherein the second valve is a solenoid valve or an air operation valve.

19. The apparatus of claim 12, wherein the apparatus further comprises:
   a plurality of thermal insulation components to maintain a temperature of the processing liquid.

* * * * *